US011810612B2

(12) United States Patent
Roberts

(10) Patent No.: US 11,810,612 B2
(45) Date of Patent: **\*Nov. 7, 2023**

(54) APPARATUSES AND METHODS FOR ROW HAMMER BASED CACHE LOCKDOWN

(71) Applicant: MICRON TECHNOLOGY, INC., Boise, ID (US)

(72) Inventor: David A. Roberts, Wellesley, MA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/591,319

(22) Filed: Feb. 2, 2022

(65) Prior Publication Data
US 2022/0199144 A1    Jun. 23, 2022

Related U.S. Application Data

(63) Continuation of application No. 17/127,654, filed on Dec. 18, 2020, now Pat. No. 11,264,079.

(51) Int. Cl.
*G11C 11/4078* (2006.01)
(52) U.S. Cl.
CPC ............... *G11C 11/4078* (2013.01)
(58) Field of Classification Search
CPC ......... G11C 11/4078; G11C 7/24; G11C 8/20; G11C 11/408
USPC ........................................................ 365/118
See application file for complete search history.

(56) References Cited

U.S. PATENT DOCUMENTS

| 5,299,159 | A | 3/1994 | Balistreri et al. |
| 5,654,929 | A | 8/1997 | Mote, Jr. |
| 5,699,297 | A | 12/1997 | Yamazaki et al. |
| 5,867,442 | A | 2/1999 | Kim et al. |
| 5,933,377 | A | 8/1999 | Hidaka |
| 5,943,283 | A | 8/1999 | Wong et al. |

(Continued)

FOREIGN PATENT DOCUMENTS

| CN | 1841551 A | 10/2006 |
| CN | 101026003 A | 8/2007 |

(Continued)

OTHER PUBLICATIONS

U.S. Appl. No. 16/797,658, titles "Apparatuses and Methods for Controlling Refresh Operations", filed Feb. 21, 2020.

(Continued)

*Primary Examiner* — Huan Hoang
(74) *Attorney, Agent, or Firm* — Dorsey & Whitney LLP

(57) ABSTRACT

Apparatuses, systems, and methods for row hammer based cache lockdown. A controller of a memory may include an aggressor detector circuit which determines if addresses are aggressor addresses or not. The controller may include a tracker circuit which may count a number of times an address is identified as an aggressor, and may determine if the aggressor address is a frequent aggressor address based on the count. If the address is a frequent aggressor address, a cache entry associated with the frequent aggressor address may be locked (e.g., for a set amount of time). In some embodiments, the controller may include a second tracker which may determine if the frequent aggressor address is a highly attacked address. An address mapping associated with the highly attacked address may be changed.

17 Claims, 5 Drawing Sheets

(56) References Cited

U.S. PATENT DOCUMENTS

| | | |
|---|---|---|
| 5,956,288 A | 9/1999 | Bermingham et al. |
| 5,959,923 A | 9/1999 | Matteson et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 | 3/2003 | Funyu et al. |
| 6,535,980 B1 | 3/2003 | Kumar et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,526,260 B2 | 9/2013 | Pyeon |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |
| 11,315,620 B2 | 4/2022 | Ishikawa et al. |
| 11,320,377 B2 | 5/2022 | Chen et al. |
| 11,348,631 B2 | 5/2022 | Wu et al. |
| 11,380,382 B2 | 7/2022 | Zhang et al. |
| 11,417,383 B2 | 8/2022 | Jenkinson et al. |
| 11,532,346 B2 | 12/2022 | Brown et al. |
| 11,557,331 B2 | 1/2023 | Mitsubori et al. |
| 11,610,622 B2 | 3/2023 | Rehmeyer et al. |
| 11,615,831 B2 | 3/2023 | Yamamoto |

(56) References Cited

U.S. PATENT DOCUMENTS

| | | |
|---|---|---|
| 11,626,152 B2 | 4/2023 | Wu et al. |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De Paor et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0198220 A1 | 9/2006 | Yoon et al. |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0106838 A1 | 5/2007 | Choi |
| 2007/0147154 A1 | 6/2007 | Lee |
| 2007/0165042 A1* | 7/2007 | Yagi .................. G06F 12/0875 345/557 |
| 2007/0171750 A1 | 7/2007 | Oh |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028137 A1 | 1/2008 | Schakel et al. |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |

(56) References Cited

U.S. PATENT DOCUMENTS

| | | |
|---|---|---|
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0117030 A1 | 4/2017 | Fisch et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194050 A1 | 6/2020 | Akamatsu |

(56) References Cited

U.S. PATENT DOCUMENTS

| | | |
|---|---|---|
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2021/0406170 A1* | 12/2021 | Jung .............. G06F 12/0862 |
| 2022/0059153 A1 | 2/2022 | Zhang et al. |
| 2022/0059158 A1 | 2/2022 | Wu et al. |
| 2022/0093165 A1 | 3/2022 | Mitsubori et al. |
| 2022/0165328 A1 | 5/2022 | Ishikawa et al. |
| 2022/0189539 A1 | 6/2022 | Li et al. |
| 2022/0270670 A1 | 8/2022 | Wu et al. |

FOREIGN PATENT DOCUMENTS

| | | |
|---|---|---|
| CN | 101038785 A | 9/2007 |
| CN | 101067972 A | 11/2007 |
| CN | 102301423 A | 12/2011 |
| CN | 104350546 A | 2/2015 |
| CN | 104733035 A | 6/2015 |
| CN | 104981874 A | 10/2015 |
| CN | 105529047 A | 4/2016 |
| CN | 106710621 A | 5/2017 |
| CN | 107025927 A | 8/2017 |
| CN | 107871516 A | 4/2018 |
| CN | 108154895 A | 6/2018 |
| JP | 2005-216429 A | 8/2005 |
| JP | 2011-258259 A | 12/2011 |
| JP | 4911510 B2 | 1/2012 |
| JP | 2013-004158 A | 1/2013 |
| JP | 6281030 B1 | 1/2018 |
| TW | 201801079 A | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020191222 | 9/2020 |
| WO | 2020247163 A1 | 12/2020 |
| WO | 2020247639 A1 | 12/2020 |

OTHER PUBLICATIONS

U.S. Appl. No. 16/268,818, titled "Apparatuses and Methods for Managing Row Access Counts", filed Feb. 6, 2019.

U.S. Appl. No. 16/358,587, titled "Semiconductor Device Having Cam That Stores Address Signals", dated Mar. 19, 2019.

U.S. Appl. No. 16/411,573 titled "Apparatuses, Systems, and Methods for a Content Addressable Memory Cell", filed May 14, 2019.

U.S. Appl. No. 17/008,396 titled "Apparatuses and Methods for Staggered Timing of Targeted Refresh Operations", filed Aug. 31, 2020.

U.S. Appl. No. 16/513,400 titled "Apparatuses and Methods for Tracking Row Accesses", filed Jul. 16, 2019.

U.S. Appl. No. 16/548,027 titled "Apparatuses, Systems, and Methods for Analog Row Access Rate Determination", filed Aug. 22, 2019.

U.S. Appl. No. 16/549,942 titled "Apparatuses and Methods for Lossy Row Access Counting", filed Aug. 23, 2019.Pub.

International Application No. PCT/US19/40169 titled "Apparatus and Methods for Triggering Row Hammer Address Sampling" filed Jul. 1, 2019.

International Application No. PCT/US19/64028, titled "Semiconductor Device Performing Row Hammer Refresh Operation", dated Dec. 2, 2019.

International Application No. PCT/US20/26689, titled "Apparatuses and Methods for Staggered Timing of Targeted Refresh Operations", dated Apr. 3, 2020.

International Search Report and Written Opinion for PCT/US2020/026689 dated Jul. 22, 2020.

International Search Report and Written Opinion for Application No. PCT/US2019/040169, dated Oct. 25, 2019.

PCT Application No. PCT/US20/32931, titled "Apparatuses and Methods for Controlling Steal Rates", dated May 14, 2020.

U.S. Appl. No. 16/788,657, titled "Semiconductor Device Performing Row Hammer Refresh Operation", dated Feb. 12, 2020.

U.S. Appl. No. 17/324,621 titled "Apparatuses and Methods for Pure-Time, Self-Adopt Sampling for Row Hammer Refresh Sampling", filed May 19, 2021.

U.S. Appl. No. 15/881,256 entitled 'Apparatuses and Methods for Detecting a Row Hammer Attack With a Bandpass Filter', filed on Jan. 26, 2018.

U.S. Appl. No. 16/425,525 titled "Apparatuses and Methods for Tracking All Row Accesses", filed May 29, 2019.

U.S. Appl. No. 16/427,105 titled "Apparatuses And Methods For Priority Targeted Refresh Operations", filed May 30, 2019.

U.S. Appl. No. 16/427,140 titled "Apparatuses and Methods for Tracking Row Access Counts Between Multiple Register Stacks", filed May 30, 2019.

U.S. Appl. No. 16/437,811 titled "Apparatuses, Systems, and Methods for Determining Extremum Numerical Values", filed Jun. 11, 2019.

U.S. Appl. No. 16/537,981 titled "Apparatuses and Methods for Controlling Targeted Refresh Rates", filed Aug. 12, 2019.

U.S. Appl. No. 16/994,338 titled "Apparatuses, Systems, and Methods for Memory Directed Access Pause", filed Aug. 14, 2020.

U.S. Appl. No. 16/997,766 titled "Refresh Logic Circuit Layouts Thereof", filed Aug. 19, 2020.

U.S. Appl. No. 16/997,659 titled "Apparatuses, Systems, and Methods for Refresh Modes", filed Aug. 19, 2020.

U.S. Appl. No. 17/095,978 titled "Apparatuses and Methods for Controlling Refresh Timing", filed Nov. 12, 2020.

U.S. Appl. No. 17/175,485 titled "Apparatuses and Methods for Distributed Targeted Refresh Operations", filed Feb. 12, 2021.

U.S. Appl. No. 15/789,897, entitled "Apparatus and Methods for Refreshing Memory", filed Oct. 20, 2017; pp. all.

U.S. Appl. No. 15/796,340, entitled: "Apparatus and Methods for Refreshing Memory", filed Oct. 27, 2017 pp. all.

U.S. Appl. No. 16/012,679, titled "Apparatuses and Methods for Multiple Row Hammer Refresh Address Sequences", filed Jun. 19, 2018.

U.S. Appl. No. 16/020,863, titled "Semiconductor Device", filed Jun. 27, 2018.

U.S. Appl. No. 16/112,471 titled "Apparatuses and Methods for Controlling Refresh Operations", filed Aug. 24, 2018.

U.S. Appl. No. 16/160,801, titled "Apparatuses and Methods for Selective Row Refreshes", filed Oct. 15, 2018, pp all.

U.S. Appl. No. 16/176,932, titled "Apparatuses and Methods for Access Based Refresh Timing", filed Oct. 31, 2018.

U.S. Appl. No. 16/208,217, titled "Semiconductor Device Performing Row Hammer Refresh Operation", filed Dec. 3, 2018.

(56) References Cited

OTHER PUBLICATIONS

U.S. Appl. No. 16/230,300, titled "Apparatuses and Methods for Staggered Timing of Targeted Refresh Operations", filed Dec. 21, 2018.
U.S. Appl. No. 16/231,327 titled "Apparatuses and Methods for Selective Row Refreshes", filed Dec. 21, 2018.
U.S. Appl. No. 16/237,291, titled "Apparatus and Methods for Refreshing Memory", filed Dec. 31, 2018.
U.S. Appl. No. 16/290,730, titled "Semiconductor Device Performing Row Hammer Refresh Operation", filed Mar. 1, 2019.
U.S. Appl. No. 16/374,623, titled "Semiconductor Device Performing Row Hammer Refresh Operation", filed Apr. 3, 2019.
U.S. Appl. No. 16/411,698 title "Semiconductor Device", filed May 14, 2019.
U.S. Appl. No. 16/427,330 titled "Apparatuses and Methods for Storing Victim Row Data", filed May 30, 2019.
U.S. Appl. No. 16/431,641 titled "Apparatuses and Methods for Controlling Steal Rates", filed Jun. 4, 2019.
U.S. Appl. No. 16/682,606, titled "Apparatuses and Methods for Distributing Row Hammer Refresh Events Across a Memory Device ", filed Nov. 13 2019.
U.S. Appl. No. 15/876,566 entitled 'Apparatuses and Methods for Calculating Row Hammer Refresh Addresses in a Semiconductor Device', filed Jan. 22, 2018.
U.S. Appl. No. 15/656,084 Titled: Apparatuses and Methods for Targeted Refreshing of Memory, filed Jul. 21, 2017.
U.S. Appl. No. 16/459,520 titled "Apparatuses and Methods for Monitoring Word Line Accesses", filed Jul. 1, 2019, pp. all.
PCT Application No. PCT/US18/55821 "Apparatus and Methods for Refreshing Memory" filed Oct. 15, 2018., pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory", filed Nov. 14, 2018, pp. all.
U.S. Appl. No. 17/030,018, titled "Apparatuses and Methods for Controlling Refresh Operations", filed Sep. 23, 2020, pp. all.
"U.S. Appl. No. 15/281,818, entitled: "Semiconductor Device", filed Sep. 30, 2016".
Kim, et al., "Flipping Bits in MemoryWithout Accessing Them: An Experimental Study of DRAM Disturbance Errors", IEEE, Jun. 2014, 12 pgs.
U.S. Appl. No. 17/662,733, titled "Apparatuses, Systems, and Methods for Identifying Victim Rows in a Memorydevice Which Cannot be Simultaneously Refreshed", filed May 10, 2022, pp. all pages of application as filed.
U.S. Appl. No. 17/731,529, titled "Apparatuses and Methods for Access Based Refresh Dperations", filed Apr. 28, 2022; pp. all pages of the application as filed.
U.S. Appl. No. 17/731,645, titled "Apparatuses and Methods for Access Based Targeted Refresh Operations", filed Apr. 28, 2022; pp. all pages of application as filed.
U.S. Appl. No. 17/654,035, titled "Apparatuses and Methods for Dynamic Targeted Refresh Steals", filed Mar. 8, 2022; pp. all pages of application as filed.
U.S. Appl. No. 18/064,773, filed Dec. 12, 2022, titled, "Apparatuses and Methods for Access Based Refresh Timing," pp. all pages of application as filed.
Kyungbae Park et al. "Experiments and Root Cause Analysis for Active-Precharge Hammering Fault in DDR3 SDRAM Under 3 X NM Technology"; Microelectronics Reliability: An Internet. Journal and World Abstracting Service; vol. 57, Dec. 23, 2015; pp. 39-46.
U.S. Appl. No. 18/356,502, titled "Refresh Modes for Performing Various Refresh Operation Types" filed Jul. 21, 2023.

\* cited by examiner

APPARATUSES AND METHODS FOR ROW HAMMER BASED CACHE LOCKDOWN

CROSS REFERENCE TO RELATED APPLICATION(S)

This application is a continuation of U.S. patent application Ser. No. 17/127,654 filed Dec. 18, 2020 and issued as U.S. Pat. No. 11,264,079 on Mar. 1, 2022. The aforementioned application, and issued patent, are incorporated herein by reference, in their entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Various access patterns to a particular memory cell or group of memory cells (often referred to as an attack) may cause an increased rate of data degradation in nearby memory cells. Memory cells affected by the attack may be identified and refreshed as part of a targeted refresh operation. A controller of the memory, and/or the memory itself, may track access patterns to various memory addresses in order to determine if they involved in an attack, so that they may be refreshed. However it may be useful to take additional actions beyond refreshing to mitigate data degradation.

DETAILED DESCRIPTION

Figure 1:
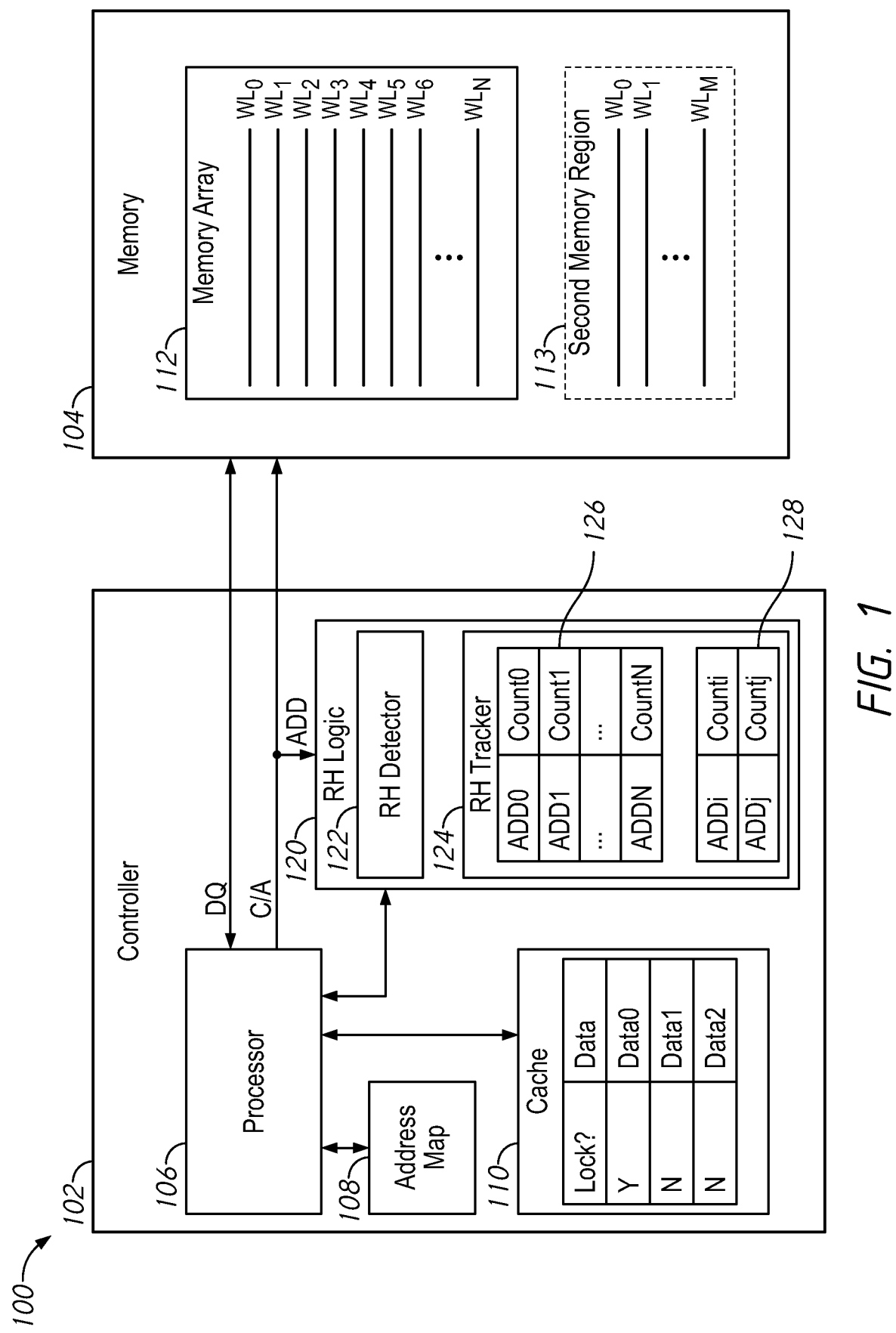
FIG. 1 is a block diagram of a memory system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. In order to prevent information from being lost or corrupted due to this decay, the memory may carry out a background refresh process, such as auto-refresh operations as part of a self-refresh mode. During a refresh operation, information may be rewritten to the wordline to restore its initial state. The auto-refresh operations may be performed on the wordlines of the memory in a sequence such that over time the wordlines of the memory are refreshed at a rate faster than the expected rate of data degradation.

Various attack patterns, such as repeated access to a particular row of memory (e.g., an aggressor row) may cause an increased rate of decay in neighboring rows (e.g., victim rows) due, for example, to electromagnetic coupling between the rows. The pattern of repeated accesses may be referred to as a 'row hammer'. These repeated accesses may be part of a deliberate attack against the memory and/or may be due to 'natural' access patterns of the memory. The row hammer attack may cause information to decay in the victim rows faster than a rate at which the auto-refresh operations may refresh the victim rows. Accordingly, aggressor rows may need to be monitored so that steps may be taken to mitigate or heal the damage before information is lost in the victim rows.

A controller of the memory may track accesses to different rows to determine if those rows are aggressors or not. An aggressor detector circuit may use one or more schemes to determine if a given address is an aggressor or not. For example, the aggressor detector may determine if a given row is accessed above a threshold number of times (or above a threshold rate) and/or may directly check for errors in the victim rows (e.g., with error correction circuitry). Various steps may be used to prevent and/or repair the damage to the victim rows. For example, a targeted refresh operation may be performed to refresh identified victims. However, targeted refresh operations may consume power and/or take time which could have been used for other operations. Accordingly, it may be desirable to mitigate attack damage through other methods (e.g., instead of or in addition to targeted refresh operations).

The present disclosure is drawn to apparatuses, systems, and methods for row hammer based cache lockdown. The controller (and/or memory) may include a cache. A set of the most recent data accessed from the memory may be stored in the cache, which may allow more rapid access to recently accessed information. Information stored in the cache may not be susceptible to the row hammer effect (or may be less susceptible). The controller may include logic, which may determine a number of times (and/or a rate) at which an identified row of the memory (e.g., an aggressor row) is accessed. If the number of times (and/or rate) is above a first threshold, the controller may manage the entry in the cache associated with an address associated with the identified row. For example, the cache may be managed in such a way as to ensure that the data associated with the identified row remains in the cache for at least a minimum amount of time.

In an example embodiment, the controller may include row hammer logic, which may count a number of times addresses are identified as aggressors. When that count exceeds a threshold (which may represent the row associated with the aggressor address being accessed at least a threshold number of times), the data associated with that aggressor address may be 'locked' so that it does not leave the cache even if the cache logic would otherwise evict it from the cache. Accordingly, while it remains locked in the cache, accesses to that aggressor address may access the information in the cache instead. This may reduce accesses to the memory array, and reduce the impact of the row hammer effect (e.g., by allowing time for the victim word lines to be refreshed as part of an auto-refresh operation).

In some embodiments, the controller may take additional steps if the row hammer tracker determines that an aggressor is frequently hammered (e.g., accessed more than a second threshold number of times). In addition to locking that data in the cache, the controller may re-map the physical word line associated with the aggressor address. For example, if the aggressor address was associated with a first word line, the controller may remap the word line so that it is now associated with a second word line, distant from the first word line. This may ensure that the victims (e.g., rows close to the first word line) are now distant from the address which is being hammered. In some embodiments, the remapped aggressor may also have a different distribution of data and/or a different type of memory to further mitigate the row hammer effect.

FIG. 1 is a block diagram of a memory system according to some embodiments of the present disclosure. The memory system 100 includes a controller 102 and a memory 104. The memory 104 includes a memory array 112 with a number of memory cells. The memory cells may be disposed at the intersection of word lines (WL, rows) and bit lines (digit lines, columns). The controller 102 may operate the memory 104 to perform access operations on the memory cells. For example, the controller 102 may write data to specified memory cells of the memory array 112 as part of a write operation and may read data from specified memory cells of the memory array 112 as part of a read operation.

The controller 102 may be coupled to the memory 104 by a number of buses. Shown in FIG. 1 are a data bus DQ and a command/address C/A bus. The controller 102 may include a processor 106 which may operate the memory 104 in part by providing commands and addresses along the C/A bus and sending and receiving data along the DQ bus. For example as part of a write operation, the processor 106 may provide a write command and an address ADD specifying one or more memory cells along the C/A bus, and may provide write data along the DQ bus. The memory 104 may then store that data to the memory cells specified by the address ADD. As part of an example read operation, the processor 106 may provide a read command and read addresses along the C/A bus and may receive read data from the memory cells specified by the address along the DQ bus.

The addresses may be associated with different memory cells of the memory array 112. For example, a column address YADD may specify one or more digit lines, a row address XADD may specify one or more word lines, and a bank address BADD may specify one or more banks of the memory array 112. The processor 106 may be coupled to an address map 108, which may specify which addresses are associated with which physical word lines WL of the memory array 112. For example, the address map 108 may indicate that a first value of the row address XADD is associated with the first word line WL0, a second value of the row address XADD is associated with a second word line WL1, etc.

The controller 102 may include a cache 110, which may be used to store information for rapid access. The cache 110 may include a data storage structure which may store information. The cache 110 may have a higher access speed than the memory 104. In some embodiments, the cache 110 may include a different type of memory cell than the memory cells in the memory 104. The cache 110 may store a set of the most recently accessed data from the memory 104. For example, data may be read from a word line, and that data may be stored in the cache 110. Any subsequent accesses to that data may be re-directed to the data stored in the cache 110 instead. The data may leave the cache (any changes to the data in the cache may be written to the memory 104) when more space is needed and the data is the oldest entry in the cache 110. The cache 110 may include a lock tag associated with the entries in the cache 110. The processor 106 may cause one or more entries in the cache 110 to become locked, in which case the data may remain in the cache until the lock is removed, even if it would otherwise be evicted from the cache.

Although the cache 110 is generally referred to herein as a component of the controller 102, in some embodiments, the cache may be located in the memory 104 (e.g., instead of or in addition to a controller side cache). It should be understood that various embodiments of the invention may also function with a memory-side cache in a manner analogous to the embodiments described with respect to a controller-side cache. For example, to impose a lockdown the controller 102 may provide a lock signal along a bus (e.g., the C/A bus) to the memory-side cache.

The controller 120 may include row hammer (RH) logic 120. The RH logic 120 may track the row addresses provided to the memory 104 as part of access operations, to determine if one or more rows is part of a (real or suspected) row hammer attack. Once the RH logic 120 determines that one or more rows is involved in an attack, it may take one or more steps to mitigate the harm.

For example, the RH logic 120 may identify a particular address of the memory 104 which is associated with a row (e.g., word line) of the memory array 112. For example, the particular address may be an aggressor address, and may be identified based on a number of accesses to the row exceeding a first threshold. The RH logic 120 may also determine the address is a frequent aggressor based, in part, on if a number of accesses to the row exceeds a second threshold (e.g., as determined by a same or different count value as used to track if the address is an aggressor). The RH logic 120 may, in some embodiments, also determine if the address is a highly attacked address based, in part, on if a number of accesses to the row exceeds a third threshold (e.g., as determined by a same or different count value as used to track if the address is a frequent aggressor).

The RH logic 120 may include a RH detector 122. The RH detector 122 may utilize one or more schemes to monitor access patterns to rows to determine if they are aggressors (e.g., targets of a RH attack or not). Embodiments of the present disclosure may use any type, or any combination of types, of row hammer detection. As used herein, the term aggressor row may be used to refer broadly to a row which meets the criteria set forth by the aggressor detector 122 to determine if a row is an aggressor or not. It is not necessary that such aggressor rows actually cause harm to nearby rows (e.g., victim rows). Similarly, as used herein, the term victim row may refer to rows which have some defined relationship to the aggressor row (e.g., adjacency, physical distance, etc.). It is not necessary that the victim rows experience an actual increased rate of data decay.

In some embodiments, the RH detector 122 may monitor a number of accesses and/or a frequency of access to addresses. For example, the RH detector 122 may receive a row address off the C/A bus and check to see if that address is in an aggressor storage structure. If it is not, the received address may be stored. If it is, the received address may be judged to be an aggressor. In some embodiments, if there is a match, a counter associated with the stored may be updated, and once the counter crosses a threshold, the received address may be judged to be an aggressor. In some embodiments, rather than receive every address off the C/A bus, sampling may be used. For example a sampling signal may be activated with random timing, semi-random timing, pseudo-random timing, periodic timing, timing based on one or more other signals, or combinations thereof. When the sampling signal is activated, a next value of address along the C/A bus may be received by the RH detector 122. In some embodiments, the RH detector 122 may check for row hammer events based on actual errors in the data read from the memory 104. For example the memory may include an error correction code (ECC) circuit which may check data for errors. If an error is detected, this may be communicated to the controller 102 and the controller 102 may determine that the data was read from a victim row.

The RH logic 120 may also include an RH tracker 124, which may be used to monitor a number of times (and/or a frequency) at which certain addresses are determined to be aggressors, which in turn may represent a number of times (and/or frequency) at which the certain address is accessed. For example, the RH tracker 124 may include a first data storage structure 126 which may store addresses and count values. When the RH detector 122 determines that an address is an aggressor, the RH tracker 124 may compare the value of the aggressor to the stored addresses. If there is a match, the count value associated with that stored address may be updated (e.g., incremented). If there is not a match, the RH tracker 124 may check to see if there is open space in the first data storage structure 126. If there is, the address may be stored, and the count associated with that address may be initialized (e.g., set to an initial value, such as 0). In some embodiments, a time stamp (not shown) associated with the address may be also be recorded. If there is not open space, then the RH tracker 124 may use one or more criteria to determine what happens (e.g., the stored address with the lowest count may be replaced, the stored address with the oldest time stamp may be replaced, etc.).

The RH tracker 124 may monitor the count values in the first data storage structure 126. The count values may be compared to a first threshold (e.g., each time one of the count values is updated). When the count value exceeds the threshold, the RH tracker 126 may determine that the aggressor address is a frequent aggressor address may provide a lock signal to the cache 110 (e.g., via the processor 106). The cache 110 may lock the data associated with the frequent aggressor row address in the cache 110. This may keep the data in the cache 110, which may prevent subsequent accesses to the memory 104 as long as the lock remains. Since the data is no longer being accessed in the memory 104, the accesses may no longer hammer that word line of the memory 104. The controller 102 may use various criteria to determine when to remove the lock. For example, the lock may be removed after a period of time (e.g., a number of clock cycles) has elapsed. When the data is evicted from the cache 110 (e.g., after the lock expires), if there were any changes to the data (e.g., via write operations), then the updated data may be written back to the memory 104 from the cache 110.

In some embodiments, the RH tracker 124 may also include a secondary data storage structure 128. While the use of a cache lockdown may offer a method of mitigating the row hammer attack for a period of time, in some situations, the attack may be serious enough to warrant a more long-term solution. The secondary data storage structure 128 may track a number of times that a given address is identified as an aggressor address. For example, each time that a count in the first data storage structure 126 exceeds a threshold, that address may be provided to the secondary data storage structure 128. The secondary data storage structure 128 may operate in a manner analogous to the primary data storage structure 126. Each time an address is received, it may be compared to the addresses already stored in the second data storage structure 128, and if there is a match, a count associated with that stored address may be changed (e.g., incremented). If the count exceeds a second threshold, it may indicate that the associated address is a highly attacked address.

In some embodiments, rather than including a secondary data storage structure 128, the RH logic may use the first data storage structure 126 to identify highly attacked addresses. For example, when the count in the first data storage structure 126 passes a first threshold, the associated address may be judged to be a frequent aggressor address. The data storage structure 126 may continue to monitor the count value, and if the count value in the first data storage structure 126 passes a second threshold then the associated address may be determined to be a highly attacked address. In such embodiments, the secondary data storage structure 128 may be omitted.

Responsive to determining that an address is a highly attacked address, the RH logic 120 may provide the highly attacked address to the processor 106. In some embodiments the RH logic 120 may also provide one or more additional signals indicating that the address is a highly attacked address. The processor 106 may alter the address map 108 based on the highly attacked address. The address map 108 may allow the processor 106 to determine where information is stored in the memory array 112. The processor 106 may alter the highly attacked address in the address map 108 in order to mitigate and/or prevent row hammer attacks to that address.

The address map 108 may include a map of virtual addresses. The virtual addresses may be accessible to an operating system which is run on the processor 106. The address map 108 may include a physical address map which may instruct the processor 106 how to generate physical address signals based on the virtual address accessed by the operating system. The address map 108 may include a physical to device map, which may indicate how the physical address is actually distributed across the structure of the memory array 112.

In some embodiments, responsive to a highly attacked address, the processor 106 may change a physical address associated with the highly attacked address. For example, the highly attacked address may a row address XADD2 associated with a word line WL2 in the memory array 112. The processor 106 may alter the physical address map so that the address XADD2 is now associated with a word line WL6, and may copy the data which was previously stored on the word line WL2 onto the word line WL6 (and the data which was on WL6 to WL2). This may move the address XADD2 so that it is accessing a word line which is remote from its previous victims (e.g., WL1 and WL3). The address which was previously associated with the replacement word line WL6 (e.g., XADD6) may be remapped in the address map 108 so that it now is associated with the word line WL2.

In some embodiments, the memory 104 may include a first memory region (e.g., memory array 112) and a second memory region 113. The second memory region 113 may represent a different memory array or a portion of the same memory array. In some embodiments, the address map 108 may be altered to remap a highly attacked address from the first region 112 to the second region 113. In some embodiments, the second memory region 113 may have different properties which make information stored therein less susceptible to the row hammer effect.

For example, the second memory section 113 may include a different type of memory cell than the primary memory array 112. For example the memory array 112 may include a first type of memory cells (e.g., DRAM cells), while the second memory region 113 may include a second type of memory cell (e.g., SRAM, FeRAM, flash, etc. cells). In some embodiments, responsive to a highly attacked address, the processor 106 may alter the address map 108 such that the highly attacked address is remapped from the first type of memory cell (e.g., in memory array 112) to the second type of memory cell (e.g., in second memory region 113).

In some embodiments, the processor 106 may alter the physical to device mapping of a highly attacked address. The memory 104 may include a first section 112 with a first type of physical to device mapping and a second section 113 with a second type of physical to device mapping. The highly attacked address may be remapped from one section to the other. For example, the first memory region 112 may have a first type of striping, and the second memory region 113 may have a second type of striping.

Figure 2:
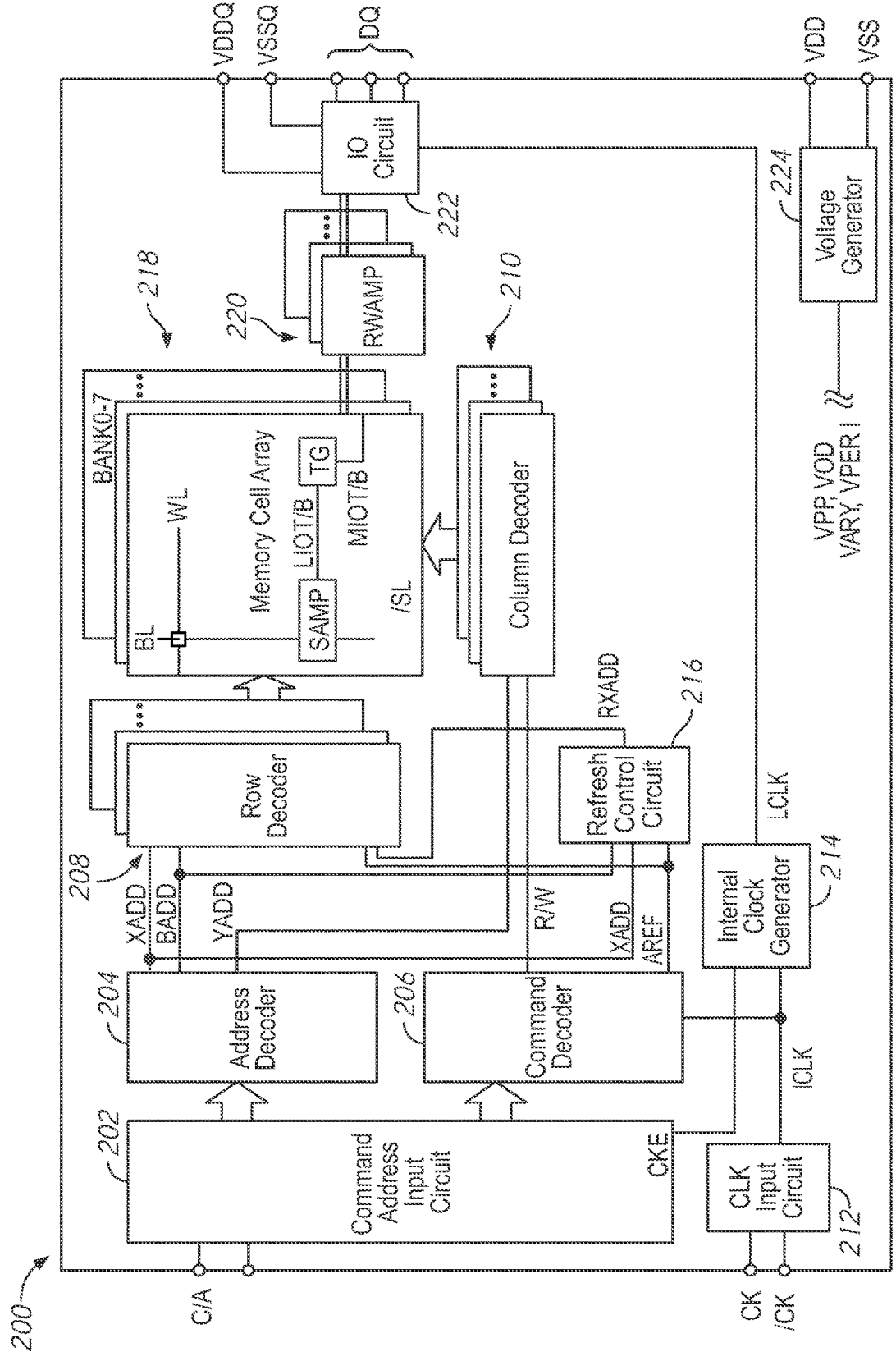
FIG. 2 is a block diagram of a semiconductor device according an embodiment of the disclosure.

FIG. 2 is a block diagram of a semiconductor device according an embodiment of the disclosure. The semiconductor device 200 may be a semiconductor memory device, such as a DRAM device integrated on a single semiconductor chip. The semiconductor device 200 may, in some embodiments, be included in the memory 104 of FIG. 1.

The semiconductor device 200 includes a memory array 218 (e.g., memory array 112 and/or second memory region 113 of FIG. 1). The memory array 218 is shown as including a plurality of memory banks. In the embodiment of FIG. 1, the memory array 218 is shown as including eight memory banks BANK0-BANK7. More or fewer banks may be included in the memory array 218 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 208 and the selection of the bit lines BL and /BL is performed by a column decoder 210. In the embodiment of FIG. 1, the row decoder 208 includes a respective row decoder for each memory bank and the column decoder 210 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 220 over complementary local data lines (LIOT/B), transfer gate (TG), and complementary main data lines (MIOT/B). Conversely, write data outputted from the read/write amplifiers 220 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 200 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ. A controller (e.g., 102 of FIG. 1) may be coupled to various terminals via one or more buses in order to send and receive various signals to or from the memory device 200.

The clock terminals are supplied with external clocks CK and /CK by the controller. The clock signals are provided to an input circuit 212. The external clocks may be complementary. The input circuit 212 generates an internal clock ICLK based on the CK and /CK clocks. The ICLK clock is provided to the command decoder 210 and to an internal clock generator 214. The internal clock generator 214 provides various internal clocks LCLK based on the ICLK clock. The LCLK clocks may be used for timing operation of various internal circuits. The internal data clocks LCLK are provided to the input/output circuit 222 to time operation of circuits included in the input/output circuit 222, for example, to data receivers to time the receipt of write data.

The C/A terminals may be supplied with memory addresses by the controller. The memory addresses supplied to the C/A terminals are transferred, via a command/address input circuit 202, to an address decoder 204. The address decoder 204 receives the address and supplies a decoded row address XADD to the row decoder 208 and supplies a decoded column address YADD to the column decoder 210. The address decoder 204 may also supply a decoded bank address BADD, which may indicate the bank of the memory array 218 containing the decoded row address XADD and column address YADD. The C/A terminals may be supplied with commands by the controller. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 206 via the command/address input circuit 202. The command decoder 206 includes circuits to decode the internal command signals to generate various internal signals and commands for performing operations. For example, the command decoder 206 may provide a row command signal to select a word line and a column command signal to select a bit line.

The device 200 may receive an access command which is a read command from the controller. When a read command is received, and a bank address, a row address and a column address are timely supplied with the read command, read data is read from memory cells in the memory array 218 corresponding to the row address and column address. The read command is received by the command decoder 206, which provides internal commands so that read data from the memory array 218 is provided to the read/write amplifiers 220. The read data is output to outside from the data terminals DQ via the input/output circuit 222.

The device 200 may receive an access command which is a write command from the controller. When the write command is received, and a bank address, a row address and a column address are timely supplied with the write command, write data supplied to the data terminals DQ is written to a memory cells in the memory array 218 corresponding to the row address and column address. The write command is received by the command decoder 206, which provides internal commands so that the write data is received by data receivers in the input/output circuit 222. Write clocks may also be provided to the external clock terminals for timing the receipt of the write data by the data receivers of the input/output circuit 222. The write data is supplied via the input/output circuit 222 to the read/write amplifiers 220, and by the read/write amplifiers 220 to the memory array 218 to be written into the memory cell MC.

The device 200 may also receive commands from the controller causing it to carry out one or more refresh operations as part of a self-refresh mode. In some embodiments, the self-refresh mode command may be externally issued to the memory device 200 (e.g., by the controller 102 of FIG. 1). In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 206 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and may cause the device 200 to return to an idle state and/or resume other operations.

The refresh signal AREF is supplied to the refresh control circuit 216. The refresh control circuit 216 supplies a refresh row address RXADD to the row decoder 208, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 208. In some embodiments, the number of wordlines represented by the refresh address RXADD may vary from one refresh address to another. The refresh control circuit 216 may control a timing of the refresh operation, and may generate and provide the refresh address RXADD. The refresh control circuit 216 may be controlled to change details of the refreshing address RXADD (e.g., how the refresh address is calculated, the timing of the refresh addresses, the number of wordlines represented by the address), or may operate based on internal logic.

The refresh control circuit 216 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD (and in some embodiments, one more additional signals indicating the type of operation), the row decoder 208 may perform a targeted refresh or auto-refresh operation. The automatic refresh addresses may be from a sequence of addresses which are provided based on activations of the refresh signal AREF. The refresh control circuit 216 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

The power supply terminals are supplied with power supply potentials VDD and VSS. The power supply potentials VDD and VSS are supplied to an internal voltage generator circuit 224. The internal voltage generator circuit 224 generates various internal potentials VPP, VOD, VARY, VPERI, and the like based on the power supply potentials VDD and VSS supplied to the power supply terminals. The internal potential VPP is mainly used in the row decoder 208, the internal potentials VOD and VARY are mainly used in the sense amplifiers SAMP included in the memory array 218, and the internal potential VPERI is used in many peripheral circuit blocks.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 222 so that power supply noise generated by the input/output circuit 222 does not propagate to the other circuit blocks.

Figure 3:
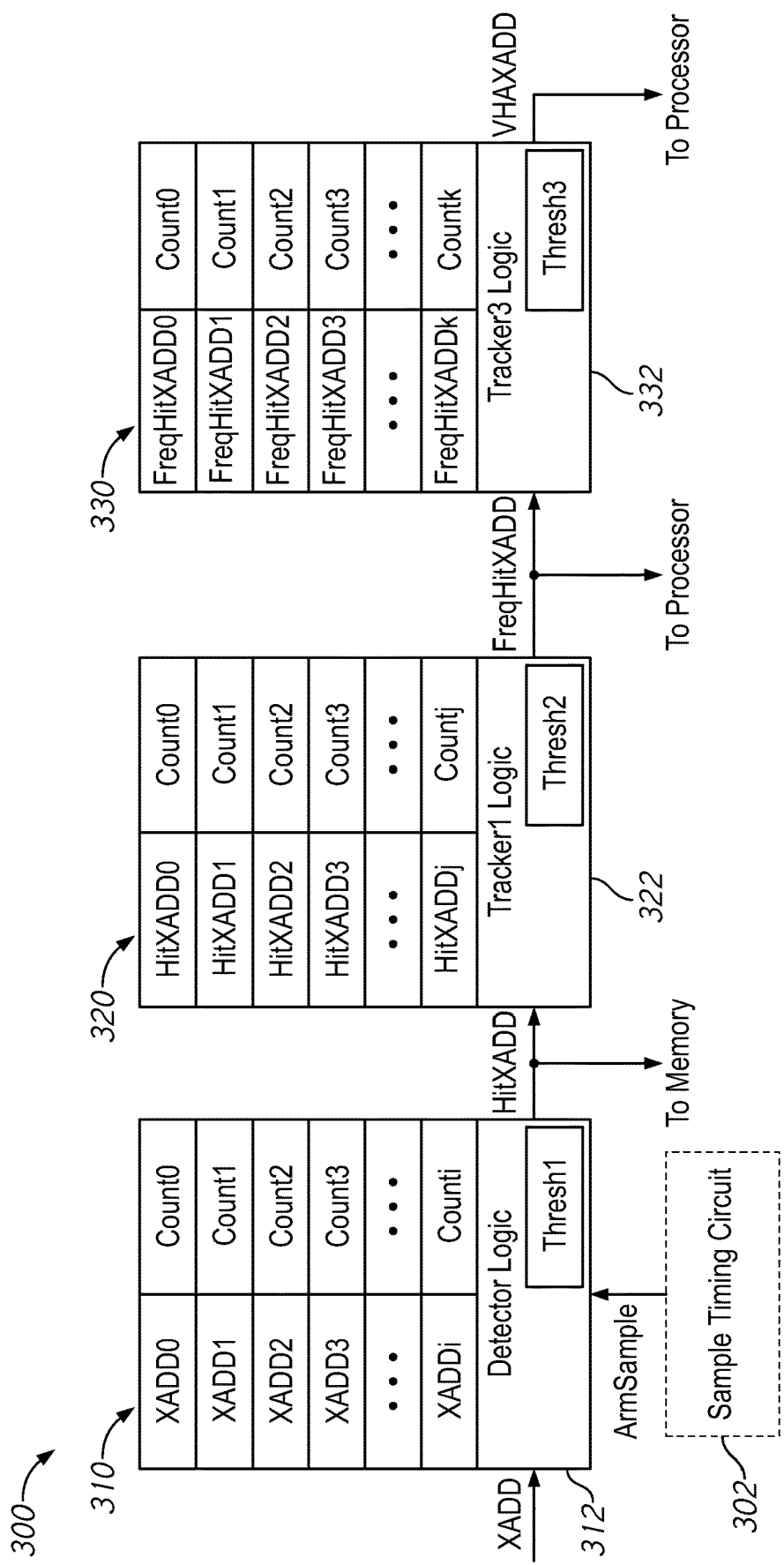
FIG. 3 is a block diagram of row hammer logic according to some embodiments of the present disclosure.

FIG. 3 is a block diagram of row hammer logic according to some embodiments of the present disclosure. The row hammer logic 300 may, in some embodiments, be included in the row hammer logic 120 of FIG. 1. The row hammer logic 300 represents an embodiment where a count based scheme is used for the aggressor detector and the RH tracker logic. Other methods of detecting aggressor addresses and tracking the frequency (and/or number of times) that those aggressors appear may be used in other example embodiments.

The row hammer logic 300 includes an aggressor detector circuit 310 (e.g., RH detector 122 of FIG. 1). The aggressor detector circuit 310 includes a data storage structure which holds a number of row addresses XADD and a number of counts, each associated with one of the stored row addresses XADD (and/or with one of the storage slots). The aggressor detector circuit 310 also includes detector logic 312, which manages the information stored in the aggressor storage structure 310.

The data storage structure may be organized into slots, each of which may store a row address (e.g., XADD0 to XADDi) and an associated count value (e.g., Count0 to Counti). Each slot may include a number of individual cells, each of which may store a bit of information. In some embodiments, the data storage structure may include content addressable memory (CAM) cells, which may provide a match signal if a provided comparison bit matches the stored bit.

The detector logic 312 may receive a row address XADD from the row address bus. The row address XADD may be associated with an access operation that the controller (e.g., controller 102) is performing on the memory (e.g., 104 of FIG. 1). The detector logic 312 may compare the received address to the stored addresses XADD0 to XADDi. If the received address matches one of the stored addresses, the count associated with that stored address may be changed (e.g., incremented). If there is not a match, the detector logic 312 may store the received address XADD in the storage structure. For example, if there is an open slot in the data storage structure, the address XADD may be stored in that open slot. If there is not an open slot, then one or more criteria may be used to determine which of the stored addresses should be replaced (e.g., the one with the lowest count value). In some embodiments, when a new address is stored in the data storage structure, the count value may be reset to an initial value (e.g., 0). In some embodiments, if the new address replaces a previously stored address, the count value associated with the previously stored address may be kept.

After updating a count value, the detector logic 312 may compare the updated count value to a first threshold Thresh1. If the updated count value exceeds the threshold Thresh1 (or if it meets or exceeds the threshold Thresh1), then the detector logic 312 may determine that the received row address XADD represents an aggressor address HitXADD. The aggressor address HitXADD may be provided to the memory (and/or a signal indicating that the address is an aggressor may be provided), so that the memory may perform a targeted refresh operation on victim word lines associated with that aggressor address (e.g., HitXADD+1, HitXADD−1, HitXADD+2, HitXADD−2, etc.). Responsive to determining that the row address XADD, and its stored counterpart, was an aggressor, the detector logic 312 may change the count value associated with the aggressor address. For example, the count value may be reduced (e.g., by the threshold Thresh1) or may be reset (e.g., to 0). In some embodiments, the stored address may be cleared responsive to being provided as the aggressor address HitXADD.

In some embodiments, the threshold Thresh1 may be inherent to the structure used to hold the count value. For example, the count may be stored as an N-bit number, with $2^N$ possible states. Each time there is a match, the count value may be incremented. When it reaches its maximum value, it may 'roll-over' back to an initial value (e.g., 0). The detector logic 312 may treat the rolling over as the count exceeding the threshold, and thus the maximum value of the count may act as the threshold.

In some embodiments, the aggressor detector 310 may sample row addresses XADD off the row address bus rather than receiving every row address XADD. An optional sample timing circuit 302 may provide a sample timing signal ArmSample. When the sampling signal ArmSample is activated, the detector logic 312 may capture the next value of XADD (e.g., the next time ACT is provided). The sample timing circuit 302 may provide the signal ArmSample with random timing, semi-random timing, pseudo-random timing, periodic timing, timing based off of one or more other signals (e.g., counts of ACT), or combinations thereof.

Other forms of aggressor detection may be used in other example embodiments. For example, rather than including a data storage structure and count values, the aggressor detector 310 may store addresses, and may provide the address XADD as the aggressor address HitXADD if the address XADD matches one of the stored addresses. In some embodiments, the aggressor detector 310 may provide any sampled address XADD as the address HitXADD. Other aggressor detection schemes may be used in other example embodiments.

The row hammer logic 300 also includes a first tracker circuit 320 and a second tracker circuit 330 (e.g., 126 and 128 respectively of FIG. 1). The tracker circuits 320 and 330 may generally be analogous to the aggressor detector 310, and so for the sake of brevity, features and operations already described with respect to the aggressor detector 310 will not be repeated for the tracker circuits 320 and 330.

The first tracker circuit 320 receives the aggressor address HitXADD and determines if the aggressor address HitXADD is a frequent aggressor address FreqHitXADD. The first tracker circuit 320 may store received aggressor addresses HitXADD along with associated count values, and determine if an address is a frequent aggressor address FreqHitXADD based, in part, on a comparison of the count value to a threshold Thresh2.

The identified frequent aggressor addresses FreqHitXADD may be provided to a processor (and/or a signal may be provided indicating that a frequent aggressor has been located), and the processor may lock the data in the cache associated with the frequent aggressor address. Since subsequent accesses to that data will be in the cache rather than in the memory array, this may mitigate hammering of the word line in the memory array.

The second tracker circuit 330 may receive the frequent aggressor address FreqHitXADD and determine if the frequent aggressor address FreqHitXADD is a highly attacked address VHAXADD. The second tracker circuit 330 may store received frequent aggressor addresses FreqHitXADD from the second tracker circuit 320, and may store the received frequent aggressor addresses along with associated count values. The second tracker circuit 330 may determine if the frequent aggressor address FreqHitXADD is a highly attacked address VHAXADD based, in part, on a comparison of the associated count value to a threshold Thresh3.

The identified highly attacked address VHAXADD may be provided to a processor (and/or a signal may be provided indicating that a highly attacked address has been located), and the processor may alter the address map to change a word line associated with the address VHAXADD. For example, the address VHAXADD may be remapped to a different wordline that is distant from the word line originally associated with VHAXADD. In some embodiments, the address VHAXADD may be remapped to a different section of the memory array, which may be less susceptible to the row hammer effect. For example the new section may have different physical to device mapping (e.g., different striping), may include different types of memory cell, or combinations thereof.

In some embodiments, the second tracker circuit 330 may be omitted and the row hammer tracker 300 may not detect highly attacked addresses.

In some embodiments, the second tracker circuit 330 may be omitted and the first tracker circuit 320 may identify both the frequent aggressor addresses FreqHitXADD and the highly attacked addresses VHAXADD. For example, the tracker logic 322 may include two threshold values (e.g., Thresh2 and Thresh3). When the count value exceeds the threshold Thresh2, the address HitXADD may be judged to be a frequent aggressor FreqHitXADD and the count value may be maintained. If the count value then exceeds a second threshold (e.g., Thresh3), then the address may be judged to be a highly attacked address VHAXADD.

In some embodiments, the tracker circuits 320 and/or 330 may include a time stamp associated with each address and count value. When a new address is written to the trackers 320 and/or 330, either in an open slot or overwriting a previous entry, the tracker logic 322 or 332 respectively may write a time stamp which represents a time when that entry was added. If there are no open slots, then when a new entry needs to be added, the entry with the oldest time stamp may be replaced with the new entry.

Figure 4:
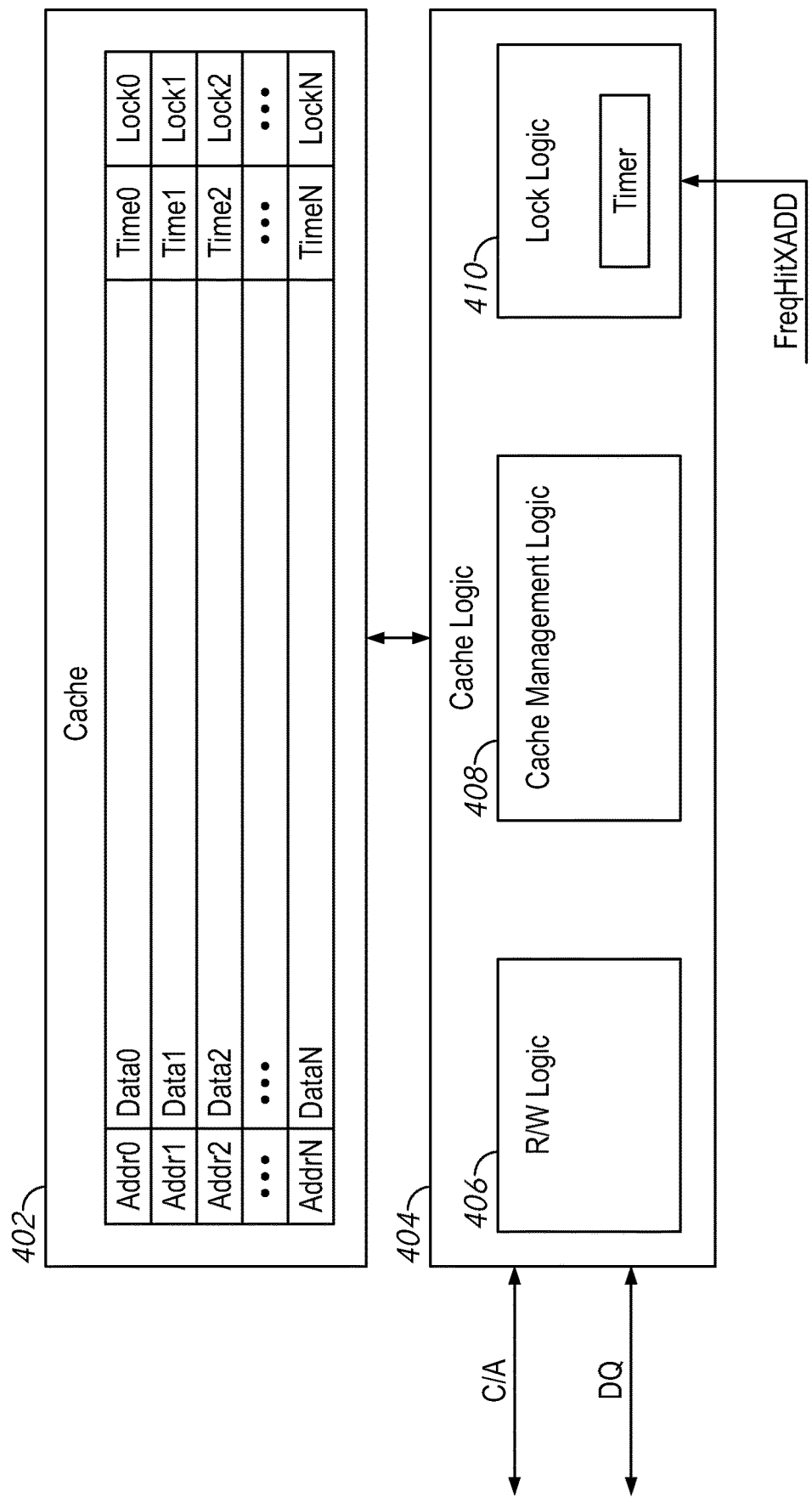
FIG. 4 is a block diagram of a cache and cache logic according to some embodiments of the present disclosure.

FIG. 4 is a block diagram of a cache and cache logic according to some embodiments of the present disclosure. The cache 402 may, in some embodiments, be included in the cache 110 of FIG. 1. The cache logic 404 may, in some embodiments, represent one or more operations of a processor (e.g., 106 of FIG. 1) and/or other logic circuits of the controller (e.g., 102 of FIG. 1).

The cache 402 may include a data storage structure, which may temporarily store data retrieved from a memory. For example, when the controller issues a read command to the memory, the data retrieved as part of that read operation may be stored in the cache 402. Subsequent accesses to that data may access the data stored in the cache 402 rather than accessing the word line in the memory. The data storage structure may include a number of slots, each of which may store data, and an address Addr, a time stamp Time, and a lock flag Lock associated with that data.

The cache logic 404 shows various components which may manage the contents of the cache 402. For example, read/write logic 406 may determine if data is accessed from the cache 402 or if that data should be accessed from the memory. The cache management logic 408 may manage entries in the cache 402.

When data is retrieved from the memory, the cache management logic 408 may store that data stored in the cache 402 along with a time stamp Time which indicates when that data was accessed. If the cache 402 is full, the cache management logic 408 may check the time stamps in the cache 402 and the data in the cache 402 which has the oldest time stamp may be replaced. When data is added to the cache, the RAY logic 406 may indicate that accesses to the address(es) associated with that data should be redirected to the cache 402 rather than the memory.

For example read operations may be performed by receiving an address. The R/W logic 406 may check the address against the addresses in the cache 402 (and/or an address map may indicate that the data is in the cache) and the data associated with that address may be read out from the cache 402. Similarly a write operation may be performed by writing information to the entry in the cache 402. When data leaves the cache 402, the RAY logic 406 may determine if any changes were made to the data in the cache 402 (e.g., due to write operations) and may write the changed data back to the memory.

The cache logic 404 may include lock logic 410 which may manage lock operations in the cache 402. For example, each slot of the cache 402 may include a lock flag. In some example embodiments, the lock flag may be a single bit, which may be active to indicate the entry in that slot is locked, and inactive to indicate the entry in that slot is not locked. When a particular slot is locked, the normal criteria for removing entries from the cache 402 may be overridden, and the locked entry may remain in the cache 402. For example, when a new entry is received and there are no open slots in the cache 402, the cache management logic 408 may check the time stamps and locate the slot which is associated with the oldest time stamp. However, if the lock flag of that slot is active (e.g., the data is locked in the cache), then the cache management logic 408 may proceed to the slot with the next oldest time stamp which has an inactive lock flag.

The lock logic 410 may use various criteria to determine when to activate the lock flag of a given entry, and when to inactivate an active lock flag. For example, responsive to receiving a frequent aggressor address FreqHitXADD, the lock logic 410 may activate the lock flag in the cache slot associated with the frequent aggressor address FreqHitXADD. The lock logic 410 may include a timer, and may maintain the lock on the entry associated with FreqHitXADD for at least a set period of time. Once the timer indicates that the amount of time has elapsed (e.g., based on a comparison of the current time with the time stamp associated with the entry), the lock logic 410 may inactivate the lock associated with the entry.

Figure 5:
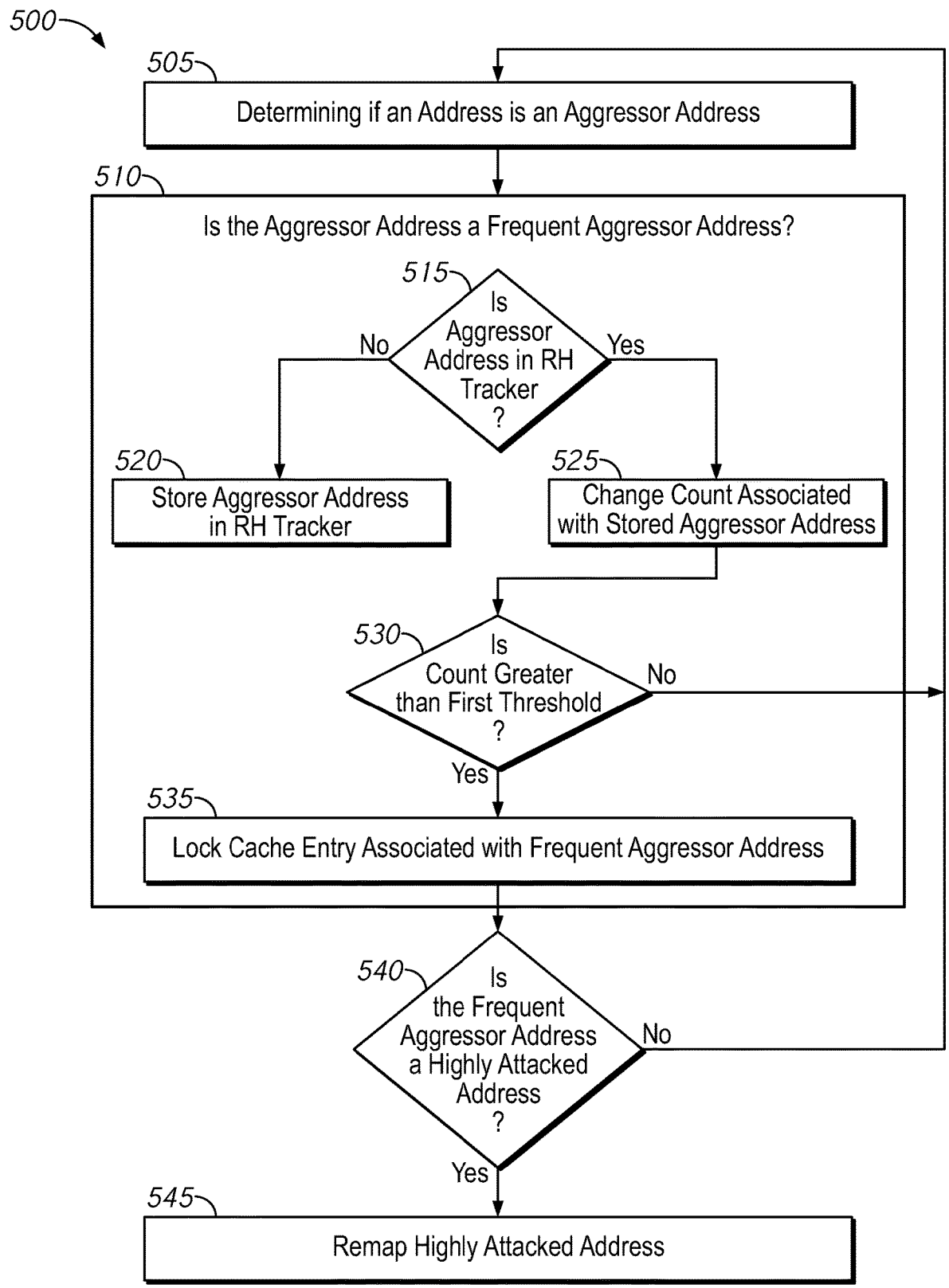
FIG. 5 is a block diagram of a method according to some embodiments of the present disclosure.

FIG. 5 is a block diagram of a method according to some embodiments of the present disclosure. The method 500 may, in some embodiments, be implemented on one or more of the apparatuses or systems described herein (e.g., in FIGS. 1-4). The method 500 shows a particular arrangement of steps, however other arrangements of steps may be used in other embodiments.

The method 500 may generally begin with box 505, which describes identifying a row of memory associated with a particular address, for example by determining if an address is an aggressor address. The address may be part of an access operation performed by a controller on a memory. The controller (e.g., 102 of FIG. 1) may provide the address along with a command along a command address (C/A) bus to the memory. The address may specify one or more organizational levels of the memory. For example, a row address may specify one or more rows (word lines) of the memory.

The controller may use one or more criteria to determine if the address is an aggressor address. Any scheme or combination or schemes to detect an aggressor address may be used. For example, the controller may monitor a number of times that a given address is provided, a frequency of accesses to the address, or combinations thereof. In some embodiments, the controller may use error tracking to determine when an address is an aggressor address.

Box 505 may generally be followed by box 510 which describes determining if the aggressor address is a frequent aggressor address. The controller may monitor a number of times and/or a frequency at which an aggressor address is identified (e.g., a number and/or frequency of accesses to the row associated with the aggressor address) and then may determine if the aggressor address is a frequent aggressor address based on the number and/or frequency. Box 510 shows a particular implementation of how to determine if the aggressor is a frequent aggressor address (e.g., boxes 515-535) however other implementations may be used in other embodiments.

Box 515 describes comparing the particular address (e.g., the aggressor) to a plurality of stored addresses and changing a count value based, in part, on that comparison. For example, box 515 may describe determining if the aggressor address is present in a row hammer (RH) tracker circuit (e.g., 124 of FIG. 1). The RH tracker circuit may include a data structure (e.g., 126 of FIG. 1) which may store aggressor addresses along with various other information associated with that aggressor address. The aggressor address may be compared to the addresses already stored in the data storage structure.

If there is a match, the method may proceed to box 520, which describes storing the aggressor address in the RH tracker circuit. For example, if there is an open slot in the data storage structure, the aggressor address may be stored and a count value associated with the aggressor address may be initialized. In some embodiments, a time stamp may be stored indicating when the aggressor address was stored. If there is not an open slot in the data storage structure, an existing entry may be overwritten. For example, the entry with the lowest count value or the oldest time stamp may be overwritten.

If there is a match between the aggressor address and one of the stored addresses, then the box 515 may be followed by box 525, which describes changing a count value associated with the stored aggressor address. For example, the count value may be incremented.

Box 525 may generally be followed by box 530, which describes determining if the row of the memory (associated with the aggressor address) has been accessed at least a threshold number of times based, in part, on the count value. For example, box 520 may describe determining if the count value is greater than a first threshold value. If the count value is not, then the aggressor may be judged to not be a frequent aggressor address and the method 500 may return to box 505. If the count value is greater than the threshold, then the aggressor address may be judged to be a frequent aggressor address and box 525 may be followed by box 530.

Box 530 describes managing a cache entry associated with the particular address based, in part, on the determination that the row of the memory has been accessed at least the threshold number of times. For example box 530 may describe locking a cache entry associated with the frequent aggressor address. For example, cache logic may activate a lock flag associated with the cache entry. While the lock flag is active, the data may remain in the cache, which may override other criteria used to determine when the data leaves the cache. The method 500 may include deactivating the lock flat a set time after activating the lock flag.

The method 500 may include retrieving data from a memory array of the memory and storing the data in the cache (which may be part of the memory or part of the controller). While the data is in the cache, the method 500 may include directing accesses to that data to the cache rather than to the memory array. The method 500 may include evicting the data from the cache, which may include writing the evicted data back to the memory. The method 500 may include preventing data from being evicted while the lock flag associated with the data is active.

Block 510 may generally be followed by block 540 if the aggressor address is determined to be a frequent aggressor address. Block 540 describes determining if the frequent aggressor address is a highly attacked address. The method 500 may include tracking a number of times and/or a frequency at which a given address is identified as a frequent aggressor address and then determining that the frequent aggressor address is a highly attacked address based on the number and/or frequency. For example block 540 may describe describes determining if the row of the memory has been accessed at least a second threshold number of times.

Various methods may be used to determine if the frequent aggressor address is a highly attacked address. For example, in a manner analogous to the method described in boxes 515-530, the RH tracker circuit may include a second data structure (e.g., 128 of FIG. 1) which may store frequent addresses along with various other information associated with that frequent aggressor address. A count value may be changed based on a comparison of the frequent aggressor address to the stored frequent aggressor addresses and comparing the count to a second threshold may determine if the frequent aggressor address is a highly attacked address.

If the frequent aggressor address is not a highly attacked address, the method may return to box 505. If the frequent aggressor address is determined to be a highly attacked address, then box 540 may generally be followed by box 545, which describes remapping the highly attacked address. For example, the method 500 may include remapping the highly attacked address from a first memory region with a first type of striping to a second memory region with a second type of striping.

As used herein, an activation of a signal may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a cache configured to store data associated with an address in a cache entry; and
    cache logic configured to change a count value based on a number of accesses associated with the address and configured to lock the cache entry based on the count value, wherein the cache logic is configured to activate a lock flag to lock the cache entry, and wherein the cache logic is configured to store a stored address and increase the count value each time the address matches the stored address.

2. The apparatus of claim 1, wherein the cache logic is configured to lock the cache entry for an amount of time.

3. The apparatus of claim 1, further comprising a processor configured to provide the address as part of an access operation on a memory.

4. An apparatus comprising:
    a cache configured to store data associated with an address in a cache entry; and
    cache logic configured to change a count value based on a number of accesses associated with the address and configured to lock the cache entry based on the count value, wherein the cache logic is configured to activate a lock flag to lock the cache entry, and wherein the cache logic is configured to change a second count value each time the address is accessed, change the count value each time the second count value crosses a threshold, and lock the cache entry when the count value crosses a threshold.

5. An apparatus comprising:
a cache configured to store data associated with an address in a cache entry; and
cache logic configured to change a count value based on a number of accesses associated with the address and configured to lock the cache entry based on the count value, wherein the cache logic is configured to activate a lock flag to lock the cache entry, and wherein the cache logic is configured to change a second count value each time the count value is changed, and configured to remap the address when the second count value exceeds a threshold.

6. A method comprising:
changing a count value based on a number of times an address is accessed, wherein the address is compared to a plurality of stored addresses and the count value is changed if the address matches one of the stored addresses;
storing data associated with the address in a cache entry; and
locking the cache entry based on the count value, wherein locking the cache entry includes activating a lock flag.

7. The method of claim 6, further comprising locking the cache entry for an amount of time.

8. The method of claim 6, further comprising accessing memory cells of a memory array based on the address.

9. The method of claim 6, further comprising storing the address as one of the plurality of stored addresses if the address does not match any of the plurality of stored addresses.

10. A method comprising:
changing a count value based on a number of times an address is accessed;
storing data associated with the address in a cache entry;
locking the cache entry based on the count value, wherein locking the cache entry includes activating a lock flag;
changing a second count value each time the address is accessed;
changing the count value each time the second count value crosses a threshold; and
locking the cache each time the count value crosses a second threshold.

11. A method comprising:
changing a count value based on a number of times an address is accessed;
storing data associated with the address in a cache entry;
locking the cache entry based on the count value, wherein locking the cache entry includes activating a lock flag;
changing a second count value each time the count value crosses a first threshold; and
remapping the address responsive to the second count value crossing a second threshold.

12. An apparatus comprising:
a first data storage structure configured to store a first plurality of addresses and to change a first count value each time an address matches one of the first plurality of addresses and provide a first command signal when the first count value crosses a first threshold;
a second data storage structure configured to store a second plurality of addresses and change a second count value each time the address provided by the first data storage structure matches one of the second plurality of addresses, and configured to provide the address when the second count value crosses a second threshold; and
a cache configured to store data associated with the address in a cache entry, wherein the cache entry is locked responsive to the address being provided by the second data storage structure.

13. The apparatus of claim 12, further comprising: a third data storage structure configured to store a third plurality of addresses and to change a third count value each time the address provided by the second data storage structure matches one of the third plurality of count values, and configured to provide the address when the third count signal crosses a third threshold.

14. The apparatus of claim 13, wherein the address is remapped in an address map responsive to the address being provided by the third data storage structure.

15. The apparatus of claim 12, further comprising a sample timing circuit configured to provide a sampling signal, and wherein first data storage structure is configured to receive the address responsive to the sampling signal.

16. The apparatus of claim 12, wherein the cache entry is locked for set amount of time.

17. The apparatus of claim 12, wherein the address is remapped in an address map responsive to the second count value crossing a third threshold.

* * * * *